United States Patent [19]

Imai et al.

[11] Patent Number: 4,740,263

[45] Date of Patent: Apr. 26, 1988

[54] PROCESS FOR PREPARING THIN FILM AND P-TYPE DIAMOND SEMICONDUCTOR

[75] Inventors: Yoshio Imai, No. 3-36-4 Horinouchi, Suginami-ku, Tokyo; Atsuhito Sawabe, Yokohama, both of Japan

[73] Assignee: Yoshio Imai, Tokyo, Japan

[21] Appl. No.: 724,271

[22] Filed: Apr. 17, 1985

[51] Int. Cl.[4] .............................................. C30B 25/06
[52] U.S. Cl. ................................... 156/613; 156/614; 156/DIG. 68; 156/DIG. 102; 427/42
[58] Field of Search .............. 156/602, 606, 613, 614, 156/DIG. 68, DIG. 102, DIG. 103; 427/34, 42; 423/446

[56] References Cited

U.S. PATENT DOCUMENTS 4,238,525 12/1980 Aichert et al. ................... 156/102 X

OTHER PUBLICATIONS

Rocca et al; Glow-Discharge-Created Electron Beams: Cathode Materials, Electron Gun Designs, and Technological Applications; J. Appl. Phys. 56(3) 8-1-84, pp. 790-797.
Thompson et al; Electron Beam Assisted Chemical Vapor Deposition of SiO$_2$; Appl. Phys. Lett. 43(8), 10-15-83, pp. 777-779.
Seiichiro Matsumoto et al., "Vapor Deposition of Diamond Particles from Methane", *Japanese Journal of Applied Physics*, vol. 21, No. 4, Apr., 1982, pp. L-183-L-185.
Seiichiro Matsumoto et al., "Growth of Diamond Particles from Methane-Hydrogen Gas", *Journal of Material Science*, vol. 17, 1982, pp. 3106-3112.
B. V. Spitsyn et al., "Vapor Growth of Diamond on Diamond and Other Surfaces", *Journal of Crystal Growth*, vol. 52, 1981, pp. 219-226.
Sol Aisenberg et al., "Ion-Beam Deposition of Thin Films of Diamondlike Films", Applied Physics Letters, vol. 29, No. 2, Jul. 15, 1976, pp. 118-120.
C. Weissmantel et al., "Structure and Properties of Quasi-Amorphous Films Prepared by Ion Beam Techniques", *Thin Solid Films*, vol. 72, 1980, pp. 19-31.
Toshio Mori et al., "Crystal Structure of Diamondlike Carbon Films Prepared by Ionized Deposition from Methane Gas", *Journal of Applied Physics*, vol. 55, No. 9, May 1, 1984, pp. 3276-3279.

*Primary Examiner*—Barry S. Richman
*Assistant Examiner*—Michael S. Gzybowski
*Attorney, Agent, or Firm*—Sandler & Greenblum

[57] ABSTRACT

A process for preparing a diamond thin film by an electron assisted chemical vapor deposition (EACVD) is disclosed, in which diamond crystal nuclei are caused to form and grow to a thin film on a heated plate substrate under electron bombardments in an atmosphere of a mixed gas of hydrogen and a hydrocarbon in a reduced pressure. A Boron doped p-type diamond semiconductor is prepared by an addition of a trace amount of diborane in the mixed gas of the hydrogen and the hydrocarbon in said EACVD.

22 Claims, 4 Drawing Sheets

10 μm

10 μm

10 μm

10 μm

PROCESS FOR PREPARING THIN FILM AND P-TYPE DIAMOND SEMICONDUCTOR

FIELD OF THE INVENTION

This invention relates to processes for preparing a diamond thin film and a p-type diamond semiconductor by an electron assisted chemical vapor deposition (EACVD).

BACKGROUND OF THE INVENTION

The growth of diamond thin films from the vapor phase have been tried according to several kinds of methods, for example, thermal or plasma chemical vapor deposition (CVD) [S. Matsumoto, Y. Sato, M. Kamo and N, Setaka, Jpn. J. Appl. Phys. 21, L 183 (1962); S. Matsumoto, Y. Sato, M. Tsutsumi and N. Setaka, J. Mater. Sci. 17, 3106 (1982) 29; B. V. Spitsyn, L. L. Bouilov and B. V. Derjaguin, J. Cryst. Growth 52, 219 (1981)]; ion beam techniques [S. Aisenberg and R. Chabot, J. Appl Phys. 42, 2953 (1971); E. G. Spencer, P. H. Schmidt, D. C. Joy and F. J. Sansalone, Appl Phys. Lett. 29, 118 (1976); C. Weissmantel, K. Bewilogua, D. Dietrick, H. J. Erler, H. J. Hinneberg, S. Klose, W. Nowick and G. Reisse, Thin Solid Films 72, 19 (1980)] and plasma induced deposition [T. Mohri and Y. Namba, J. Appl. Phys. 55, 3276 (1984)]. The films obtained by these methods are usually called diamondlike carbon films, since they have some properties similar to those of natural diamond. From the identification of the structure by electron diffraction, however, most of these films are difficult to regard as diamond because of their amorphous structures, lack of diffraction lines which should appear, and the appearances of diffraction lines from the structure other than diamond. It is known that the diamond particles and films with good crystallinity are obtained by thermal and plasma CVD. Even in these two methods, it is hard to form a uniform film on any substrates except for diamond substrates, and the growth rate of the film is relatively low.

However, the present inventors found a surprising fact that a diamond thin film was formed when CVD was performed under an electron bombardment, thus resulting in the present invention. A part of the process of the present invention was contributed and accepted for its originality (Appl. Phys. Lett. 46(2), 146 to 147, 15 Jan. 1985). In said scientific journal, the present inventors have termed the process "EACVD". Namely, EACVD is the process in which a diamond crystal nucleus is caused to form and grow to a thin film on a heated plate substrate under an electron bombardment in an atmosphere of a mixed gas of a hydrogen and a hydrocarbon in a reduced pressure.

Accordingly, one object of the invention is to provide a process for preparing a diamond thin film by EACVD.

Another object of the invention is to provide a new material in the fields of an abrasive material, a hard-wearing material, an electrical insulating material for high cooling utilizing the diamond characteristics of high thermal conductivity, ultra-high hardness, high electrical insulation properties.

Further, the present inventors have achieved the process for preparing a Boron doped p-type diamond semiconductor in a thin film state after many trials and researches for EACVD using a mixed gas of a hydrogen, a hydrocarbon and a diborane.

Accordingly, a further object of the present invention is to provide industrially a p-type diamond semiconductor in a thin film state.

SUMMARY OF THE INVENTION

In order to achieve the above objects, the invention provides a process for preparing a diamond thin film, characterized in that diamond crystal nuclei are caused to form and grow to a thin film on a heated plate substrate under electron bombardment in an atmosphere of a mixed gas of a hydrogen and a hydrocarbon in a reduced pressure.

Further, the present invention provides a process for preparing a p-type diamond semiconductor by EACVD, characterized in that a Boron doped diamond crystal nuclei are caused to form and grow to a thin film on a heated plate substrate under electron bombardments in an atmosphere of a mixed gas of a hydrogen and a hydrocaron and a diborane in a reduced pressure.

The invention will be described in more detail hereinbelow for its preferred embodiments with reference to the accompanying drawings.

PREFERRED EMBODIMENTS OF THE INVENTION

Figure 1:
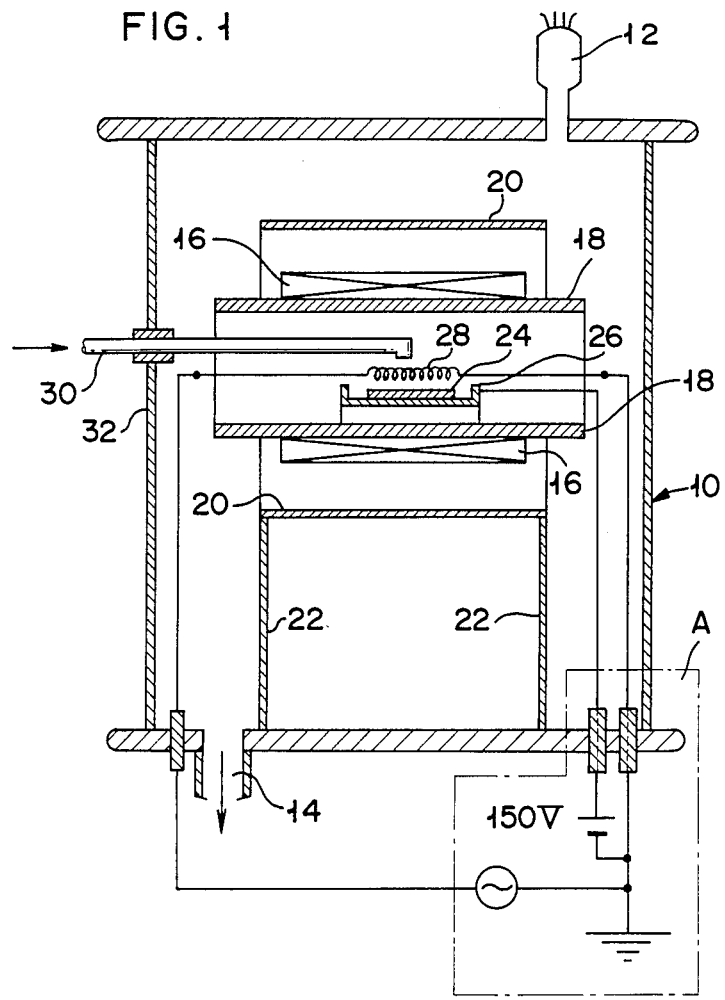
FIG. 1 is a schematic diagram of an embodiment of apparatus used in the process according to the invention.

In the process for preparing the diamond thin film by EACVD according to the invention, the top surface of the plate substrate is required to be maintained at the temperature of at least more than 400 degrees C. for the reaction. The reaction temperature is related to the amount of the electron bombardment; the lower the temperature is, the more the electron bombardment is required, and so the higher the temperature is, the less the electron bombardment is required. In general, an electron current density of about 50 to 200 $mA/cm^2$ is preferably applied at about 400 degrees C., and an electron current density of about 1 to 50 $mA/cm^2$ is preferably applied at about 900 degrees C. It is necessary for the maintenance of the reaction temperature to supply an external heating in addition to the temperature increase as the result of the electron bombardment; for example, when the reaction temperature is 800 to 900 degrees C., it is necessary to carry out the reaction in the heating cylinder 18 heated by the heating means 16 as shown in FIG. 1. Meanwhile, in the case of the lower reaction temperature, it is convenient to heat the plate substrate from the side with the radiation heat of the heating means 16a and 16b respectively, of FIG. 8 or 9.

In FIG. 1, as to the electron bombardment, the top surface of the plate substrate 24 is subjected to the electron shower by the impression voltage between the plate substrate and the heating tungsten filament 28. This method can be easily applied, and is suitable for the electron bombardment of the relatively low electron current density (1 to 50 mA/cm$^2$).

Figure 2:
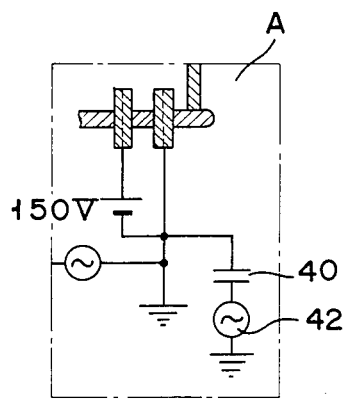
FIG. 2 is a schematic diagram of a charged-up electron removing means other than that shown in line part A of FIG. 1.
Figure 8:
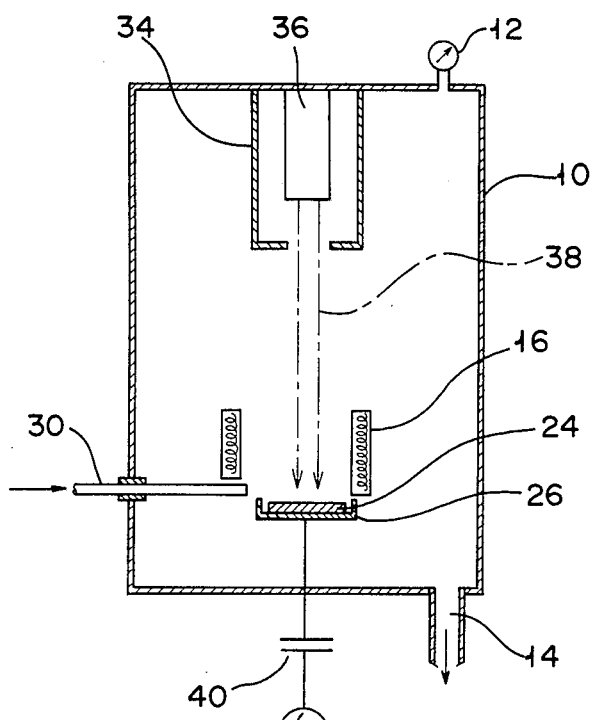
FIG. 8 is a schematic diagram of another embodiment of apparatus used in the process according to the invention.
Figure 9:
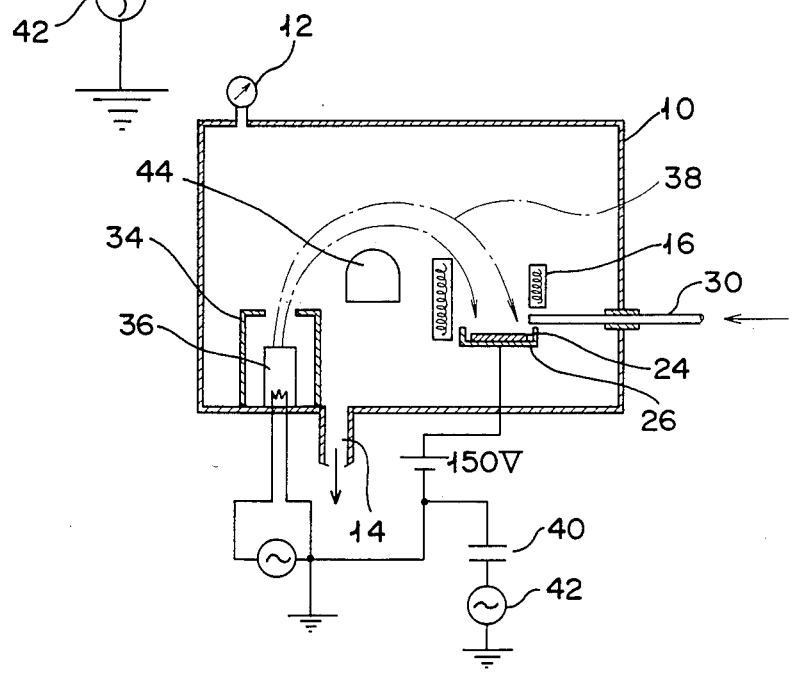
FIG. 9 is a schematic diagram of another embodiment of apparatus used in the process according to the invention.

In the meantime, as shown in FIG. 8 or 9, the method using the electron gun 36 with an acceleration voltage of 100 to 1000 V (in the range of no discharge) is suitable for the electron bombardment of the relatively higher electron current density (50 to 200 mA/cm$^2$). The substrate is able to be composed of even non-conductor material, and charged-up electrons on the top surface of the plate substrate are removed preferably through the holder 26 connected with the ground circuit of a capacitor and the high-frequency generator 42 in FIG. 2 and the ground. As the diamond thin film is forming, the film itself works as a non-conductor layer, and it is suitable to use the charged-up electron removing ground circuit of the capacitor, the high-frequency generator and the ground as well as the ground circuit of the positive and negative terminals of the direct current source and the ground as shown in FIG. 2 or 9.

A mixed gas of a hydrocarbon and a hydrogen is used as the raw gas of the diamond thin film and the volume ratio of the hydrocarbon to hydrogen is selected from the range of 1/1 to 1/200. The mixed gas is introduced in the container at an inner pressure of $10^{-5}$ to 50 Torr after the reaction container is evacuated in a high vacuum, for example $10^{-8}$ Torr, but when the electron gun is used, the degree of the vacuum is selected to be $10^{-5}$ to $10^{-2}$ Torr. It is suitable to arrange the opening of the gas pipe in the neighborhood of the top surface of the plate substrate and introduce the mixed gas parallel to the top surface. It is preferred to maintain an inner pressure of the mixed gas and a uniform composition of the mixed gas under a proper evacuation of a vacuum pump and a uniform introduction of the mixed gas and to remove decomposition products on the top surface of the plate substrate, for example, to introduce the mixed gas at about 10 to 300 SCCM for a small-laboratory-scale container (About 0.1 to 0.2 m$^3$). The hydrocarbon can be a member selected from the group consisting of saturated. Unsaturated, chain and cyclic lower hydrocarbon compounds, for example, methane, propane, ethylene, acetylene, cyclohexane, benzene and the like, but methane is most preferable owing to economics, reactivity and highest content of hydrogen.

The substrate material can be heat-resisting inorganic materials having a melting point of at least more than 600 degrees C, selected from the group consisting of elemental metals, alloys, ceramics, glasses, carbons or these composite materials.

With regard to the functions of electron bombardments according to EACVD of the invention, the reaction temperature is lowered to 400 to 900 degrees C. and the forming numbers of diamond nuclei are unexpectably remarkably increased. Not only does the diamond thin film form and grow, but the diamond crystal growth rate is also increased Conventional thermal CVD provides formations and growths of discontinuous diamond nuclei as the result of decomposition of methane at about 2000 degrees C. and removal of graphite and other impurities by means of hydrogen.

Next, the process for preparing the p-type diamond semiconductor is performed by the addition of a trace amount of diborane to the mixed gas of the hydrocarbon and the hydrogen used in the above-mentioned process for preparing the diamond thin film, namely by the introduction of a mixed gas consisting of a hydrocarbon and a hydrogen having a volume ratio of 1/1 to 1/200 and a diborane of 1 p.p.m. to 1 p.p.b of the hydrocarbon volume. Other conditions used for the above-mentioned process for preparing the thin diamond film can be applied in the same way.

The invention will be described hereinbelow with reference to examples of the processes for preparing the diamond thin film and the p-type diamond semiconductor.

EXAMPLE 1

FIG. 1 is a schematic diagram of an apparatus for preparing the diamond thin film according to the invention. A vacuum gauge 12 is provided on an upper part of a container 10 for a vacuum evaporation and an outlet 14 is opened on the base, said outlet 14 being connected with a turbo-molecular pump (not shown). A heating apparatus is supported in the container 10, said apparatus comprising a protective case 20 and leg parts 22 which support a quartz glass heating cylinder 18 surrounded by an electric heating means 16. A silicon carbide plate substrate (5×10 mm) 24 supported on a holder 26 consisting of a molybdenum plate are arranged in the middle of the heating cylinder 18. A spiral tungsten filament is positioned 2 mm away from the plate substrate 24, the opposite ends of the tungsten filament being loaded with an alternating voltage, and a 150 V direct current voltage being impressed on the holder 26 (positive voltage) and the tungsten filament 28 (negative voltage). A gas pipe 30 for introducing a mixed gas of a hydrogen and a methane is opened in the vicinity of the tungsten filament 28, said gas pipe penetrating the wall 32 of the container 10.

Figure 3:
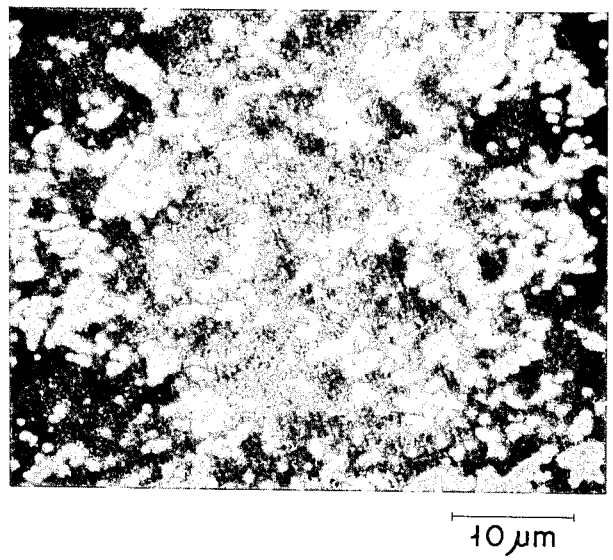
FIG. 3 is a scanning type electron microscope photograph ($\times 3000$) of a diamond grain structure after 15 minutes of a diamond thin film formation.
Figure 4:
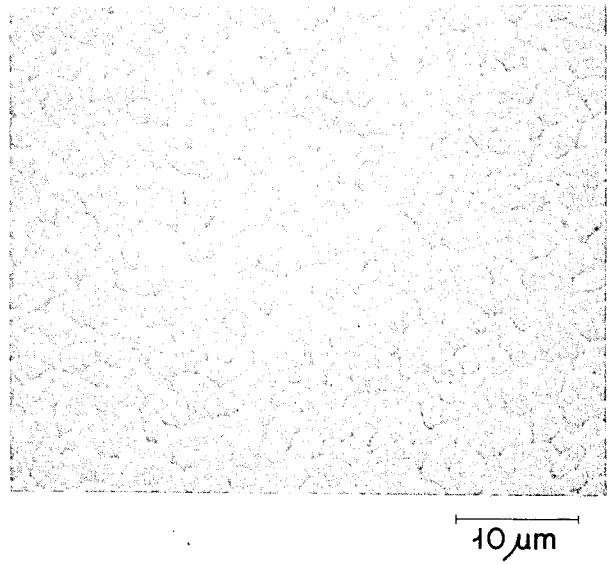
FIG. 4 is a photograph ($\times 3000$) after 60 minutes in place of 15 minutes of FIG. 3.
Figure 5:
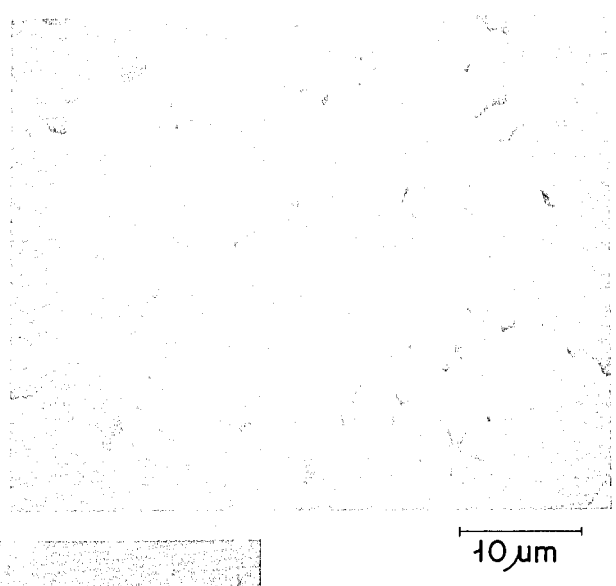
FIG. 5 is a photograph ($\times 3000$) after 120 minutes in place of 15 minutes of FIG. 3.
Figure 6:
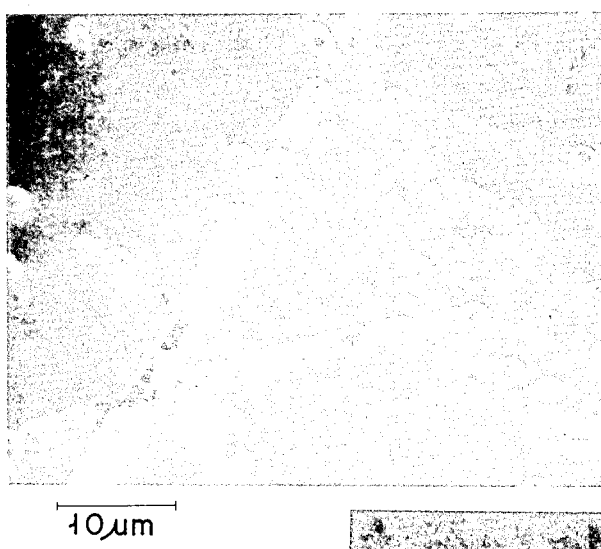
FIG. 6 is a scanning type electron microscope photograph ($\times 3000$) of a diamond grain structure after 120 minutes of a conventional thermal CVD method using no electron bombardment.
Figure 7:
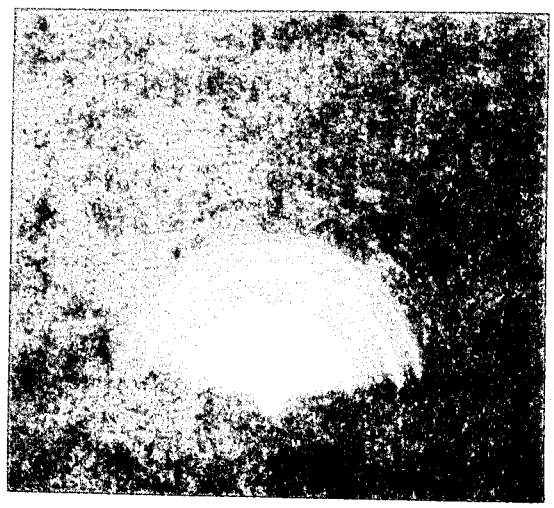
FIG. 7 is an electron diffraction photograph of a diamond thin film.

When a diamond thin film is prepared according to the apparatus of FIG. 1, first the container 10 is evacuated at 10 Torr, the quartz glass heating cylinder 18 is heated by the electric heating means to maintain the plate substrate at 850 degrees C. The tungsten filament is heated at 1900 degrees C. by an alternating current, and a mixed gas of a methane and a hydrogen having a volume ratio of 1/20 is introduced above the heated tungsten filament 28 at a gas flow rate of 300 SCCM (standard state c.c. per minute) at an inner pressure of 20 Torr, a 150 V direct current is impressed on the holder 26 (positive voltage) and the tungsten filament (negative voltage), and an electron current density is 20 mA/cm$^2$. FIGS. 3, 4 and 5 show scanning type electron microscope photographs (×3000) after 15, 60 and 120 minutes respectively. FIG. 3 shows distributions of uniform diamond spherical grains on the whole surface, FIG. 4 shows that uniform diamond spherical grains cover nearly the whole surface, FIG. 5 shows that the diamond spherical grains can not be confirmed and the flat thin film is formed on the whole surface though some indentations appear here and there. FIG. 7 shows an electron diffraction photograph of the thin film of FIG. 6, and the observed values are shown in Table 1 below.

TABLE 1

Observed interplanar spacings and reported values.

| Observed d(Å) | Reported (ASTM 6-675) d(Å) | hkl |
|---|---|---|
| 2.06 | 2.06 | 111 |
| 1.26 | 1.261 | 220 |
| 1.06 | 1.0754 | 311 |
| 1.02 | — | 222 |
| 0.88 | 0.8916 | 400 |
| 0.80 | 0.8182 | 331 |
| 0.71 | 0.7280[a] | 422 |
| 0.67 | 0.6864[a] | 511,333 |
| 0.62 | 0.6305[a] | 440 |
| 0.59 | 0.6029[a] | 531 |
| 0.55 | 0.5640[a] | 620 |

[a] Values are calculated from $a_0 = 3.5667$ Å.

According to Table 1, it is shown that the interplaner spacing calculated from the RHEED patterns of the deposited diamond thin films are in good agreement with the reported values of cubic diamond. The forbidden 222 ring can be explained in terms of the second order diffraction. The lattice constants of the deposited films calculated from the results of X-ray diffraction and of the natural diamond are 3.561 and 3.567 Å respectively. Therefore, the thin film of FIG. 5 is confirmed that it is diamond thin film from the above results.

COMPARATIVE EXAMPLE 1

Comparative example 1 is performed according to the same procedure as Example 1 except that the direct current voltage is not impressed between the tungsten filament 28 and the holder 26. FIG. 6 shows a scanning type electron microscope photograph (×3000) after 120 minutes. When FIG. 6 is compared with FIG. 5, it is clearly shown that diamonds grow as grains and are difficult to form a film structure in the case of comparison example 1 of the conventional thermal CVD, but diamond nuclei grow as a film in Example 1 of EACVD.

EXAMPLE 2

Example 2 is performed according to the same conditions as Example 1 except that the charged-up electron removing means of the grounded circuit of the holder 26, positive and negative terminals of the 150 V direct current source and the earth in line part A of FIG. 1 used in Example 1 is changed to another charged-up electron removing means of a combination grounded circuit consisting of said grounded circuit in line part A of FIG. 1 and an grounded circuit of the negative terminal, a capacitor 40, 1 MHz high-frequency generator 42 and the quartz; the plate substrate consists of quartz glass; and benzene is used in place of methane. The same diamond thin film as Example 1 is obtained.

EXAMPLE 3

A diamond thin fiilm adhering to a molybdenum plate is prepared according to the procedure of Example 1, so that the back surface of the molybdenum plate is plated by a copper vacuum evaporation which is soldered on a surface of a square copper pipe and a cold water is passed through said square copper pipe. The bit of an electric power drill is pressed against the diamond thin film to grind surface of the film. The ground surface has a glossy appearance is merely warm which is capable of being touched by hand after three minutes, and has a ground ramp capable of confirming by tactile sensation. Moreover, when a surface of a sapphire plate (Mohs hardness 9) is rubbed with the edge of the diamond thin film, the sapphire plate becomes scratched.

EXAMPLE 4

A red heat nichrome wire is pressed on the diamond thin film adhered to the copper pipe of Example 3 for three minutes and immediately after the withdrawal of the nichrome wire the heated part of the diamond thin film is not hot at all and shows no abnormal signs.

EXAMPLE 5

FIG. 8 is a schematic diagram of another apparatus for preparing the diamond thin film according to the invention. In this embodiment a quartz glass plate substrate 24 is arranged in a vacuum container 10 mounted on a holder 26. After the container 10 is evacuated through an outlet 14 at about $10^{-3}$ Torr by vacuum pump (not shown), the top surface of the plate substrate is subjected to electron beam bombardments 38 by an electron gun 36 provided in an electron gun chamber 34 under an acceleration voltage 800 V and an electron current density 100 mA/cm$^2$, and is maintained at about 600 degrees C. by regulating radiation heat from a heating means 16. A mixed gas of a methane and a hydrogen having a volume ratio of 1/20 is introduced in the container 10 at $10^{-3}$ Torr on a vacuum gauge 12. In the meantime charged-up electrons are removed from the top surface of the quartz plate substrate 24 through a grounded circuit of the holder 26, a capacitor 40, 1 MHz high-frequency generator 42 and the ground. A diamond thin film of about 5 μm thickness is obtained on the top surface of the plate substrate 24 after one hour. The diamond thin film is characterized by the same analytical methods as Example 1 and shows a diamond crystal structure, and further an electic resistance, a heat conductivity, Vicker's hardness, a graphitization temperature and an evenness of the film surface are measured.

Moreover, the evenness of the film surface is measured by the method of JIS B0601, in which the highest height (Rmax) is measured and the judgment is good for less than 1.0 μm, normal for but more than 3.0 m less than 3.0 μm, poor for more than 3.0 μm.

The results are shown collectively in table 2, and each characteristics of a natural diamond is also added in Table 2.

TABLE 2

| | Example | natural diamond |
|---|---|---|
| crystal form | diamond structure | diamond structure |
| electric resistance (Ω · cm) | 10 | 10 to 10 |
| heat conductivity (W/m · k) | 1800 | 900 to 2000 |
| vickers hardness (Hv) | 9200 | 8000 to 11000 |
| graphitization temperature (degree C.) | 1300 (in an inert gas) | 1500 (in an inert gas) |
| evenness of the film surface | good | — |
| Growth rate of the film (μm/hour) | 5 | — |

EXAMPLE 6

The conditions used in the apparatus shown in FIG. 9 for purposes of Example 6 is different from that of Example 4 as follows:

An electron gun 36 is arranged on the side of a plate substrate 24, and an electron beam orbit is diffusionally deflected with a deflection magnet 44 to bombard five times the range of the top surface of the plate substrate 24. The stainless steel plate substrate is subjected to electron bombardments from the electron gun 36 under an acceleration voltage 1000 V, an electron current density 80 mA/cm$^2$ with an introduction of an acetylene and hydrogen having a volume ratio of 1/20 so as to maintain 600 degrees C. top surface temperature. Charged-up electrons are removed through combinations of two grounded circuits consisting of one grounded circuit of the holder 26, positive and negative terminals of 150 V direct current source and the ground, and the other grounded circuit of the negative terminal of 150 V direct current source, a capacitor 40, a 1 MHz high-frequency generator and the ground.

The other conditions of Example 5 are selected to the same conditions of Example 4. Thus, Example 5 is performed so as to result with diamond thin film having a mean thickness 5 μm is obtained after 1.5 hours. The characteristics of the film is the same as that of the film of Example 4.

EXAMPLE 7

Example 7 is performed according to the same procedure as Example 4 except that diborane (B$_2$H$_6$) is added in the amount of 1 p.p.m. to a methane. The diamond thin film obtained has the characteristics of a semiconductor, and a specific resistance of $10^{-1}$ Ωm.

When diborane is added at 1 p.p.b to methane, the diamond thin film obtained has a specific resistance of $10^8$ Ωm.

According to the invention, the diamond thin film unexpected entirely from the conventional arts can be provided, and various uses applied the characteristics of diamond of high thermal conductivity, ultra-high hardness, high electrical insulation properties are able to be developed.

Moreover, Boron doped p-type diamond thin film semiconductors are able to be easily provided and it is known that p-type diamond semiconductor provide Schottky barrier layer at a junction with a metal, thus the uses in the field of diode, especially high-frequency rectification could be expected.

Although the invention has been described hereinabove with the preferred embodiments, it will be appreciated to a person skilled in the art that many variations and modifications may be possible without departing from the spirit and the scope of the invention.

What is claimed is:

1. A process for preparing a diamond thin film comprising maintaining a top surface of a plate substrate at a temperature of at least 400° C. in an atmosphere of a mixed gas of hydrogen and a hydrocarbon under reduced pressure, subjecting said top surface to electron bombardments and removing charged-up electrons from said top surface, thereby causing diamond crystal nuclei to form and grow to a thin film on said top surface of said plate substrate.

2. A process according to claim 1, wherein the temperature of said top surface of the plate substrate is maintained between 400 to 900 degrees C.

3. A process according to claim 1, wherein a volume ratio of the hydrocarbon to hydrogen is 1/1 to 1/200 and said atmosphere of said mixed gas is maintained at a pressure of $10^{-5}$ to 50 Torr.

4. A process according to claim 1, wherein a current density of the electron bombardments on said top surface of the plate substrate is 1 to 200 mA/cm$^2$.

5. A process according to claim 1, wherein said substrate comprises a heat-resistant inorganic material having a melting point of at least more than 600° C.

6. A process according to claim 5, wherein said heat-resistant inorganic material is a member selected from the group consisting of elemental metals, alloys, ceramics, glasses, carbon compounds and mixtures of these materials.

7. A process according to claim 1, further comprising providing a holder for said plate substrate in a heating cylinder arranged in an evacuated container, mounting said plate substrate on said holder, positioning a heating material for an electron emission in a predetermined space opposite to said plate substrate, subjecting said top surface of the plate substrate to bombardments of electrons emitted from the heating material loaded with an electric current from an impressed voltage of a negative charge to said heating material and a positive charge to said holder through a direct current source while removing charged-up electrons from said top surface through a grounded circuit of positive and negative terminals of said direct current source and ground, introducing a mixed gas of a predetermined volume ratio of hydrogen and a hydrocarbon through a pipe penetrating the wall of said container into said heating cylinder while maintaining the inner pressure of said container at a predetermined pressure and heating said top surface of the plate substrate by said heating cylinder.

8. A process according to claim 7, wherein the grounded circuit is connected with another grounded circuit thereby removing the charged-up electrons through the negative terminal of the direct current source, a capacitor, a high-frequency generator and the ground.

9. A process according to claim 1, wherein the hydrocarbon is a member selected from the group consisting of saturated and unsaturated hydrocarbon compounds.

10. A process according to claim 9, wherein the hydrocarbon is methane, acetylene or benzene.

11. A process according to claim 9, wherein the hydrocarbon is a member selected from the group consisting of chain and cyclic hydrocarbon compounds.

12. A process according to claim 1, further comprising arranging a holder for said plate substrate in an evacuated container, mounting said plate substrate on said holder, arranging an indirect heating means within said container to heat the top surface of the plate substrate from a side of said top surface and to maintain said top surface at a predetermined temperature, introducing a mixed gas of a predetermined volume ratio of hydrogen and a hydrocarbon in said container through a pipe while maintaining the inner pressure of said container at $10^{-5}$ to $10^{-2}$ Torr, arranging an electron gun in said container to bombard the top surface of the plate substrate with electrons, and connecting said holder with a charged-up electron removing means.

13. A process according to claim 12, wherein said electron gun is arranged on a side of said plate substrate and a electron beam orbit is diffusionally deflected with a deflection magnet to bombard a predetermined area of the top surface with electrons.

14. A process according to claim 12, wherein said charged-up electron removing means comprises (a) a grounded circuit which includes said holder, a capacitor, a high-frequency generator and a ground, or (b) a grounded circuit which includes said holder, positive and negative terminals of a direct current source and a ground, or (c) a combination of both of said grounded circuits.

15. A process according to claim 12, wherein said electron gun is arranged over the top surface of the plate substrate to bombard said top surface with electron beams.

16. A process according to claim 15, wherein said electron beams are scanned on said top surface.

17. A process for preparing a p-type diamond semiconductor comprising maintaining a top surface of a plate substrate at a temperature of at least 400° C. in an atmosphere of a mixed gas of hydrogen and a hydrocarbon and a diborane, subjecting said top surface to electron bombardments and removing charged-up electrons from said top surface so that diamond crystal nuclei are caused to form and grow to a thin film of p-type diamond semiconductor on said top surface of said plate substrate.

18. A process according to claim 17, wherein the volume ratio of the hydrocarbon to hydrocarbon is 1/1 to 1/200 and the diborane is added in 1 p.p.m. to 1 p.p.b. to the volume of the hydrocarbon.

19. A process according to claim 17, wherein the pressure of said mixed gas in the container is maintained at $10^{-5}$ to 50 Torr.

20. A process according to claim 17, wherein the top surface of the plate substrate is maintained between 400 to 900 degrees C.

21. A process according to claim 17 wherein an electron current density is maintained on said top surface between 1 to 200 mA/cm.

22. A process according to claim 17, wherein charged-up electrons are removed through (a) a grounded circuit comprising a holder, positive and negative terminals of a direct current source and a ground, or (b) a grounded circuit comprising a holder, a capacitor, a high-frequency generator and a ground, or (c) a combination of both said grounded circuits.

* * * * *

UNITED STATES PATENT AND TRADEMARK OFFICE
CERTIFICATE OF CORRECTION

PATENT NO. : 4,740,263

DATED : April 26, 1988

INVENTOR(S) : Yoshio IMAI, et al.

It is certified that error appears in the above-identified patent and that said Letters Patent is hereby corrected as shown below:

In the Patent Title, insert ---DIAMOND--- after "PREPARING" and before "THIN".

In the Abstract, at line 6, insert ---a--- after "of" and before "hydrogen".

At column 1 of the Patent Title, line 1, insert ---DIAMOND--- after "PREPARING" and before "THIN".

At column 1, line 16, delete "," after "Kamo and N" and insert ---.---.

At column 1, line 17, change "1962" to ---1982---.

At column 1, line 60, insert ---and--- after "material" and before "an".

At column 1, line 62, insert ---and--- after "hardness" and before "high".

At column 2, line 10, change "bombardment" to ---bombardments---.

At column 2, line 11, insert ---and a diborane--- after "hydrocarbon" and before "in".

At column 2, line 19, change "hydrocaron" to ---hydrocarbon---.

At column 3, line 55, change "economics" to ---economic---.

At column 3, line 59, insert ---.--- after "C" and before ",".

At column 3, line 68, insert ---.--- after "increased" and before "Conventional".

At column 5, line 50, change "an" to ---a---.

At column 5, line 52, change "quartz" to ---ground---.

UNITED STATES PATENT AND TRADEMARK OFFICE
CERTIFICATE OF CORRECTION

PATENT NO. : 4,740,263

DATED : April 26, 1988

INVENTOR(S) : Yoshio IMAI et al.

It is certified that error appears in the above-identified patent and that said Letters Patent is hereby corrected as shown below:

At column 5, line 56, change "fiilm" to ---film---.

At column 5, line 61, delete "a" after "pipe and" and before "cold".

At column 5, line 65, insert ---which--- after "appearance".

At column 5, line 65, change "warm which" to ---warm and---.

At column 6, line 14, insert ---,--- after "embodiment" and before "a".

At column 6, line 28, insert ---,--- after "meantimes" and before "charged-up".

At column 6, line 43, delete "but" after "for" and before "more".

At column 6, line 43, insert ---but--- after "3.0m" and before "less".

At column 6, line 47, change "characteristics" to ---characteristic---.

At column 7, line 9, insert ---a--- after "and" and before "hydrogen".

At column 7, line 20, change "with" to ---in a---.

At column 7, line 21, delete "is". At column 7, line 21, insert ---,--- after "5 um" and before "obtained".

At column 7, line 23, change "is" to ---are---.

At column 7, line 43, change "semiconductor" to ---semiconductors---.

UNITED STATES PATENT AND TRADEMARK OFFICE
CERTIFICATE OF CORRECTION

PATENT NO. : 4,740,263

DATED : April 26, 1988

INVENTOR(S) : Yoshio IMAI et al.

It is certified that error appears in the above-identified patent and that said Letters Patent is hereby corrected as shown below:

At column 8, line 1, delete "a" (second occurrence).

At column 8, line 62, delete "a" after "on" and before "side".

At column 8, line 63, delete "a" after "and" and before "electron".

Signed and Sealed this

Twentieth Day of June, 1989

Attest:

DONALD J. QUIGG

Attesting Officer

Commissioner of Patents and Trademarks